United States Patent [19]

Gleim et al.

[11] Patent Number: 5,394,023
[45] Date of Patent: Feb. 28, 1995

[54] CIRCUIT ARRANGEMENT FOR GENRATING SQUARE-SHAPED SIGNALS

[75] Inventors: Günter Gleim; Friedrich Heizmann; Hermann Link, all of Villingen-Schwenningen, Germany

[73] Assignee: Deutsche Thomson-Brandt GmbH, Villingen-Schwenningen, Germany

[21] Appl. No.: 61,359

[22] Filed: May 14, 1993

[30] Foreign Application Priority Data

May 15, 1992 [DE] Germany .............................. 4215811
May 18, 1992 [DE] Germany .............................. 4216022

[51] Int. Cl.6 ........................ H03K 5/01; H03K 5/153
[52] U.S. Cl. ........................................ 327/73; 327/79; 327/184; 327/205
[58] Field of Search ............... 307/260, 261, 268, 290, 307/350, 354, 647; 341/155, 159

[56] References Cited

U.S. PATENT DOCUMENTS

| | | | |
|---|---|---|---|
| 3,639,779 | 2/1972 | Garrigus | 307/354 |
| 3,916,328 | 10/1975 | Wilson | 328/150 |
| 4,015,144 | 3/1977 | Brouckaert | 307/261 |
| 4,480,200 | 10/1984 | Tan et al. | 307/354 |
| 4,499,386 | 2/1985 | Schlotzhauer et al. | 307/260 |
| 4,677,315 | 6/1987 | Blauschild et al. | 307/350 |
| 5,122,680 | 6/1992 | Stokely et al. | 307/354 |

FOREIGN PATENT DOCUMENTS 2095064 9/1982 United Kingdom .
1190506 11/1985 U.S.S.R. .

OTHER PUBLICATIONS

Patent Abstracts of Japan vol. 6 No. 211 E-137 17 Oct. 1982; 57-11502.

Primary Examiner—R. Skudy
Assistant Examiner—Shawn Riley
Attorney, Agent, or Firm—Joseph S. Trinoli; Lester L. Hallacher; Harvey D. Fried

[57] ABSTRACT

A first input signal has successive zero amplitude crossings. A first comparator generates a first bilevel output signal responsive to the first input signal. The first comparator has a hysteresis characteristic which is switched on at each said zero crossing of the first input signal and switched off prior to each occurrence of the next following zero crossing. A second input signal has successive zero amplitude crossings and is displaced in phase relative to the first input signal. A second comparator generates a second bilevel output signal responsive to the second input signal. The hysteresis characteristic is switched on by level transitions of the first bilevel output signal and switched off by level transitions of the second bilevel output signal. The first and second input signals may be sinusoidal. The hysteresis characteristic may controlled by first and second flip/flops, which are set by the first bilevel output signal and reset by the second bilevel output signal.

9 Claims, 5 Drawing Sheets

CIRCUIT ARRANGEMENT FOR GENRATING SQUARE-SHAPED SIGNALS

BACKGROUND OF THE INVENTION

1. Field of the Invention

The present invention relates to a circuit arrangement for generating square-shaped signals from sinusoidal signals with the aid of a hysteresis inflicted comparator circuit.

2. Description of Related Art

It is known to generate a square-shaped signal from a sinusoidal signal which square-shaped signal exhibits steep edges precisely at the zero crossings of the sinusoidal signal. Such a signal is suitable, for example, for switching electronic stages because it constitutes an unambiguous switching function. However, an ideal square-shaped signal ensues only in case of undisturbed input signals, i.e. which are not superimposed by disturbing oscillations. As known in the art, these cause several edges in the vicinity of the zero crossings which can be compared with contact chatter of mechanical switch contacts. Therefore, an unambiguous switching function is no longer ensured. In order to eliminate this disadvantage it is known to provide the comparator at which the square-shaped signals ensue with a switching hysteresis as described, for example, in the book by Tietze/Schenk, 4th edition, page 133/134. The effect of this switching hysteresis is that an unambiguous switching edge is not generated until an upper minimum value of the input voltage is exceeded or, respectively, when a drop below a lower minimum value of the input voltage occurs. Hereby, however, the possibility is accepted that the switching edges of the square-shaped output signal no longer temporally coincide with the zero crossings of the input signal.

SUMMARY OF THE INVENTION

Therefore, the invention provides a circuit arrangement which meets the demand that the edges of the output signal coincide with the zero crossings of the input signal and disturbances of the input signal no longer cause any chatter at the output.

These demands are met by a circuit for generating square-shaped signals, comprising: a source of a first input signal having successive zero amplitude crossings; a first comparator for generating a first bilevel output signal responsive to the first input signal, the first comparator having a hysteresis characteristic which can be switched on and off, the hysteresis being switched on at each said zero crossing of the first input signal and being switched off prior to each occurrence of the next following zero crossing; a source of a second input signal having successive zero amplitude crossings and displaced in phase relative to the first input signal; and, a second comparator for generating a second bilevel output signal responsive to the second input signal, the hysteresis characteristic being switched on by level transitions of the first bilevel output signal and being switched off by level transitions of the second bilevel output signal. The first and second input signals may be sinusoidal.

The circuit may further comprise first and second flip/flops for controlling the hysteresis characteristic responsive to the first and second bilevel output signals. In this case, the first and second flip/flops are set by the first bilevel output signal and reset by the second bilevel output signal, the first and second flip/flops controlling the switched hysteresis characteristic.

More particularly, the circuit may comprise a resistor for imparting the hysteresis characteristic, the resistor having a first terminal coupled to the first comparator and having a second terminal coupled to a junction. A first diode is anode coupled to the junction and cathode coupled to an output of one of the first and second flip/flops. A second diode is cathode coupled to the junction and anode coupled to an output of the other of the first and second flip/flops.

These demands are also met by a circuit for generating a plurality of square-shaped signals, comprising: a plurality of sources for a plurality of input signals having successive zero amplitude crossings and progressive phase displacements relative to one another; a plurality of comparators, each generating a bilevel output signal responsive to a different one of the plurality of input signals, each of the comparators having a hysteresis characteristic which can be switched on and off, the hysteresis being switched on at each zero crossing of each respective input signal and being switched off prior to each occurrence of the next following zero crossing of each respective input signal; and, the hysteresis characteristic of each comparator being switched on by level transitions of its own bilevel output signal and being switched off by level transitions of the bilevel output signal of another one of the comparators.

A pair of flip/flops may be operatively associated with each of the plurality of comparators, each pair of flip/flops being responsive to the bilevel output signal of its associated comparator and to the bilevel output signal of another one of the comparators, each pair of flip/flops controlling the hysteresis characteristic of the associated comparator.

The progressive phase displacements of the plurality of input signals define a cyclical order of operation for the plurality of comparators, each hysteresis characteristic being switched off responsive to the bilevel output signal of the next one of the comparators in the cyclical order. Each pair of flip/flops may be being responsive to the bilevel output signal of its associated comparator, for turning on the hysteresis characteristic, and to the bilevel output signal of the next one of the comparators in the cyclical order, for turning off the hysteresis characteristic.

BRIEF DESCRIPTION OF THE DRAWINGS

Subsequently, the invention is described in embodiment examples with the help of the drawing.

DETAILED DESCRIPTION OF THE PREFERRED EMBODIMENTS

Figure 1:
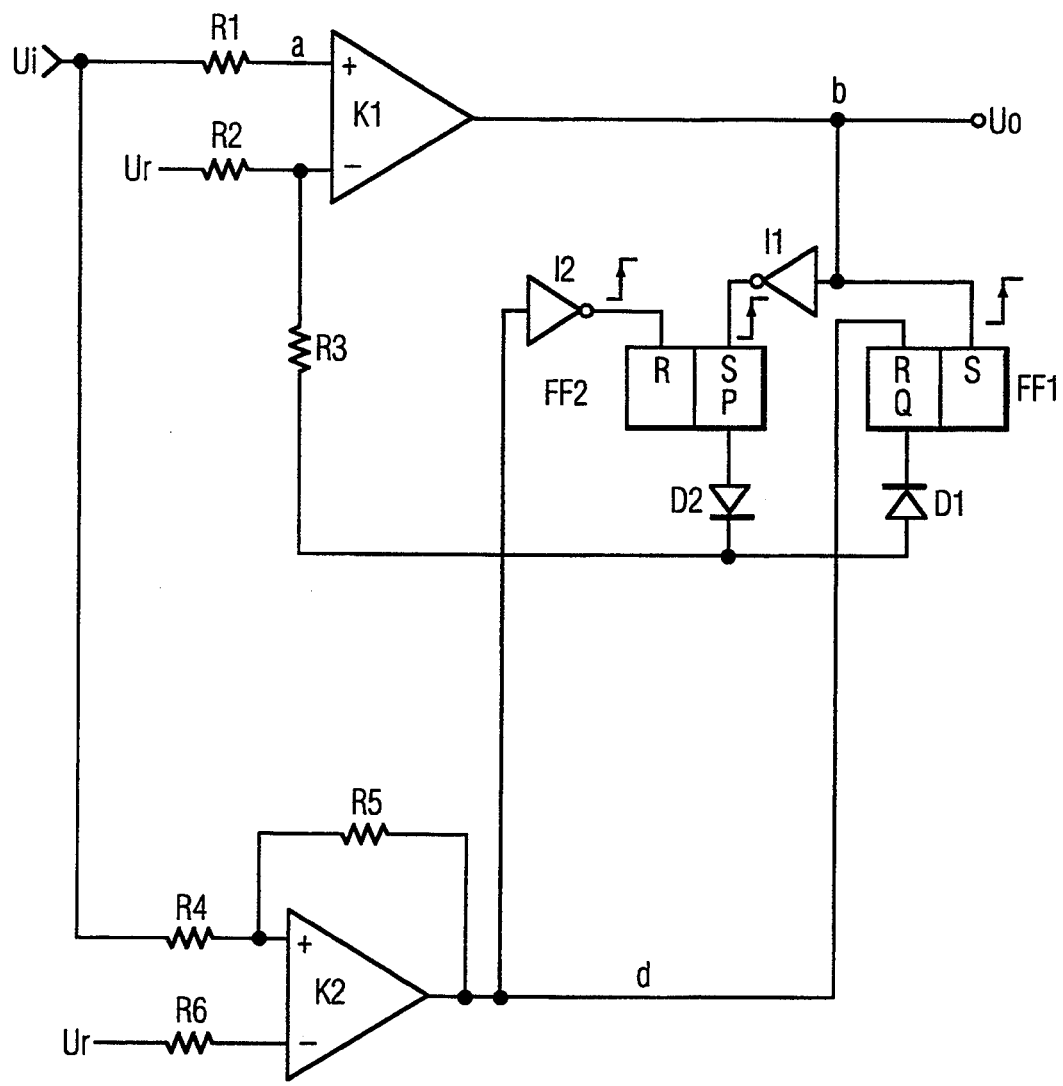
FIG. 1 shows a first embodiment example.
Figure 2A:
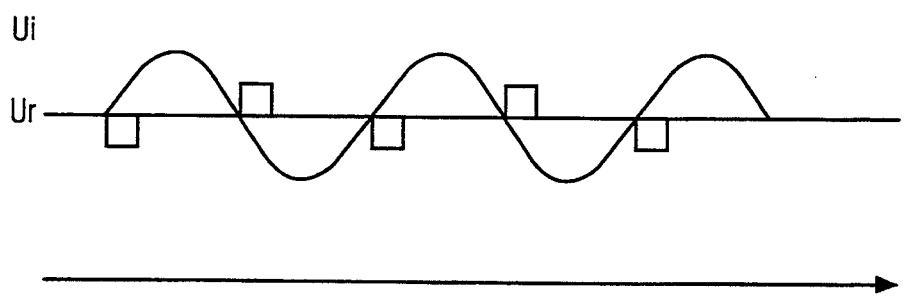
FIG. 2 shows signals at the points marked in FIG. 1.
Figure 2B:
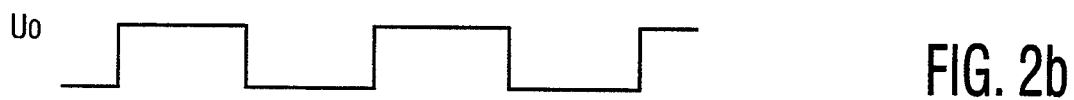
Figure 2C:
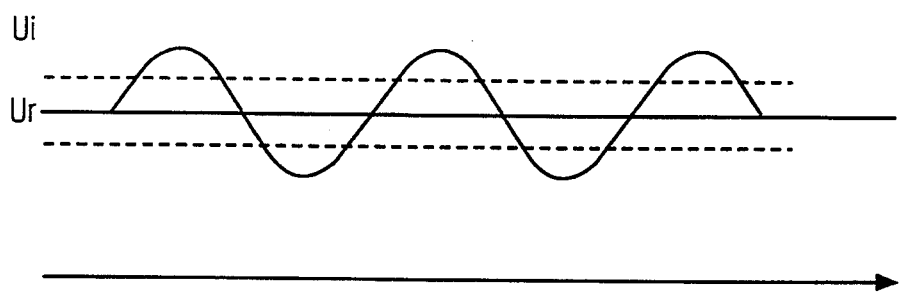
Figure 2D:
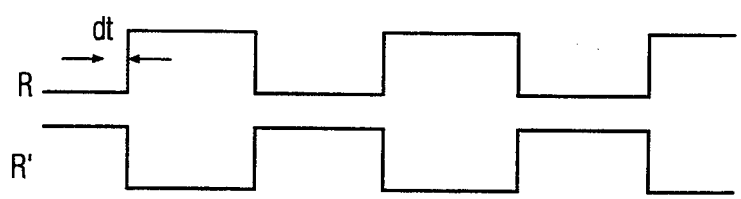

In FIG. 1 the sinusoidal input signal Ui is applied via a resistor R1 to the (+) input of a first comparator K1 at the output of which the square-shaped output signal Uo is generated. A reference voltage Ur is applied via a resistor R2 to the (−) input of the first comparator K1. The first comparator K1 is provided with a hysteresis which can be switched on and off via the resistor R3. Coupled to the output of the first comparator K1 and wired in parallel are two edge triggered RS flipflops FF1 and FF2 whereby the output signal Uo is clamped directly to the set input S of flipflop FF1 and via an inverter I1 to the set input of flipflop FF2.

The Q' output of the flipflop FF1 is coupled via the cathode-anode path of a diode D1 and the resistor R3 with the (−) input of the first comparator K1. The output of the flip flop FF2 is connected via the anode-cathode path of a diode D2 and the resistor R3 to the (−) input.

Further, the sinusoidal input signal Ui is connected via a resistor R4 to the (+) input of a second comparator K2 the output of which is fed back via the resistor R5 to the (+) input for generating a switching hysteresis. Again, the reference voltage Ur is applied to the (−) input of the second comparator K2. The output of the comparator K2 is coupled, firstly, directly with the reset input R of the first flipflop FF1 and, via an inverter I2, with the reset input R of the second flipflop FF2.

The operation of the circuit according to FIG. 1 becomes apparent in the following in connection with the signals according to FIG. 2.

In FIG. 2, the signals 'a' through 'd' are shown which are present at the respective points of the circuit in FIGURE 1. At first, the comparator K1 switches the output signal Uo to high (b) without hysteresis at the zero crossing of the input signal Ui (a). This signal simultaneously sets the flipflop FF1 so that the diode D1 at the Q' output causes the potential at the (−) input and, therewith, the switching threshold to become lower. Owing to the hysteresis (c) the output signal of the second comparator K2 becomes high only at a later time (d). The first positive edge resets the flipflop FF1 again and, therewith, neutralizes the hysteresis for the comparator K1 so that this is switched back at exactly the next following zero crossing of the input signal. The second flipflop FF2 is set via the inverter I1 whereby the P output via the diode D2 the potential at the (−) input of the comparator K1 and, therewith, the switching threshold is raised. Following the negative edge which, owing to the hysteresis of the second comparator K2, occurs at a later time, this switching threshold of the comparator K1 is switched back again by resetting flipflop FF2.

Figure 3:
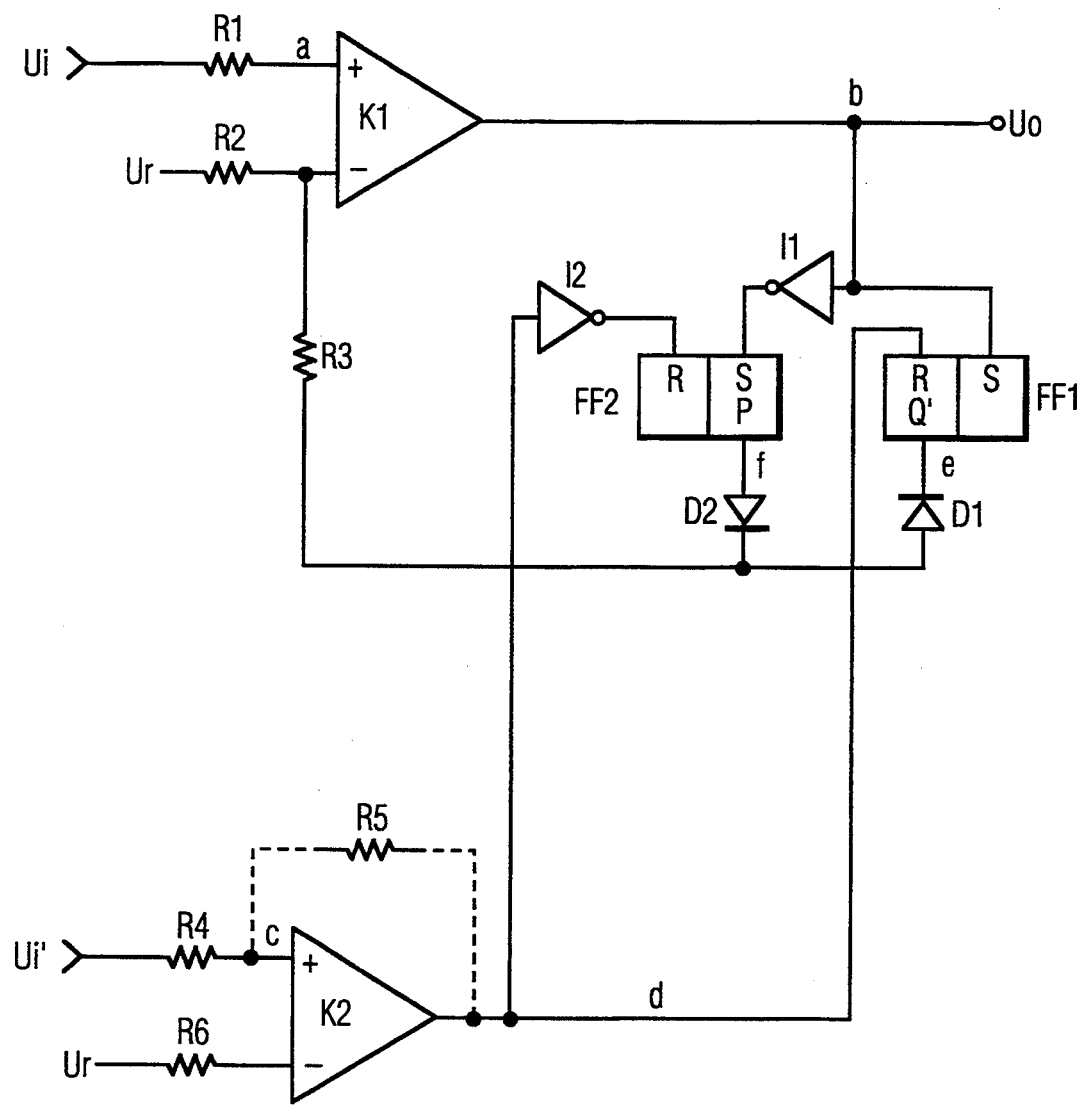
FIG. 3 shows a further embodiment example.

In FIG. 3 a further circuit example is shown which acts in a similar manner. Here, a second input signal Ui2 is applied to the second comparator K2 with hysteresis set to a fixed value or without hysteresis, said signal often being available anyhow and lying in a fixed phase relation to the first input signal. In the example a signal with a phase displacement of 900 is assumed. The operation of the circuit corresponds to the circuit explained in FIG. 1. Here too, the hysteresis switched on with the zero crossing of the input signal is switched off again always by the second signal even prior to the occurrence of the next following zero crossing.

FIG. 4 again serves for illustrating the operation of the circuit according to FIG. 3 and is depicted with its signals 'a' through 'f' at the corresponding points of the circuit.

Figure 4A:
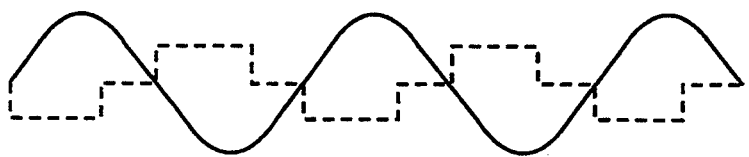
FIG. 4 shows signals at the points marked in FIG. 2.
Figure 4B:
Figure 4C:
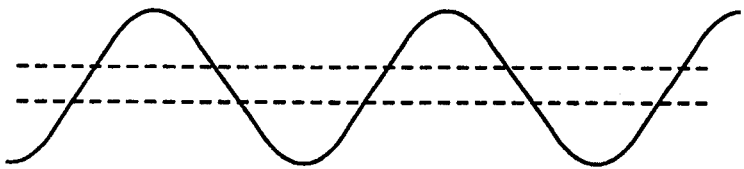
Figure 4D:
Figure 4E:
Figure 4F:

The dashed line in FIG. 4a shows the polarity and magnitude of the switched hysteresis. The switched hysteresis has a polarity which is generally opposite to that of the sinusoidal input signal. More specifically, the value is zero (that is, switched off) at a time preceding a zero crossing of the input signal, having approached zero value from a polarity direction opposite the input signal. At the zero crossing of the input signal, the output of the comparator switches the flip/flops such that the hysteresis is switched on, with a polarity opposite to that of the input signal after the zero crossing.

It is the zero crossing of the input signal for each comparator which, through the action of the flip/flops, results in the hysteresis characteristic for that comparator being switched back on, and with the necessary opposite polarity relative to the input signal. Switching of the output signal at exactly the zero crossing of the input signal is assured, and signal chatter immediately after the zero crossing is thereby prevented. The hysteresis is then turned off by the switching of the other comparator, responsive to the zero crossing of the second input signal, at a time depending on the phase displacement of the second input signal relative to the first input signal. The specific time is not critical, but must be before the next expected zero crossing of the first input signal.

The conduction of diode D1 provides negative polarity hysteresis. The reference level, or switching threshold, at the (−) input provided by signal Ur and resistor R2 is decreased. The conduction of diode D2 provides positive polarity hysteresis. The reference level, or switching threshold, at the (−) input provided by signal Ur and resistor R2 is increased. The times during which neither diode conducts corresponds to the hysteresis being switched off. The reference level, or switching threshold, at the (−) input provided by signal Ur and resistor R2 is not affected.

Figure 5:
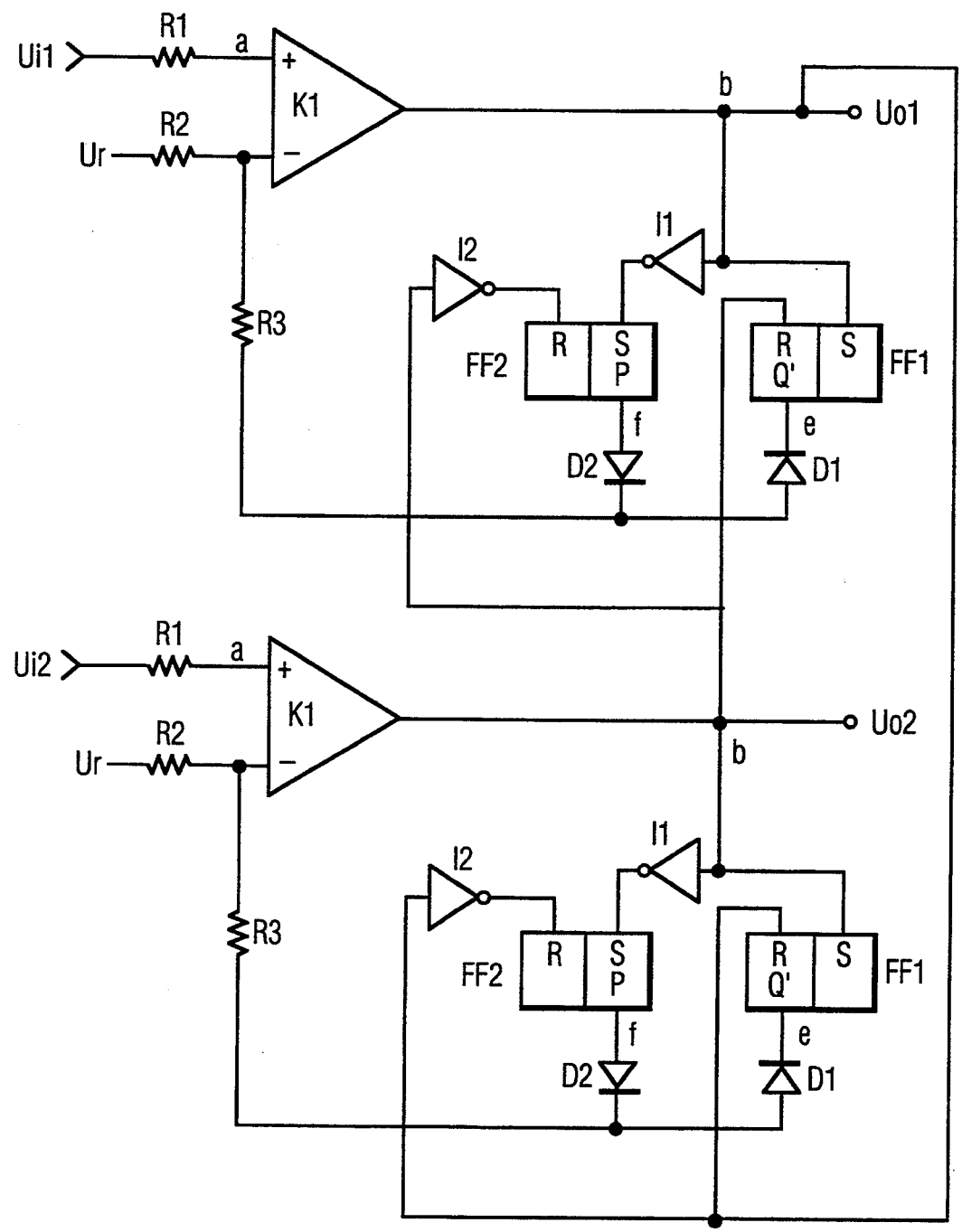
FIG. 5 shows a further embodiment example of the invention.

FIG. 5 shows a further circuit example in which two output voltages Uo1 and Uo2 via two input voltages Ui1 and Ui2 are generated which are applied to two comparator circuits K1 and K2 connected in tandem whose hysteresis can be switched on and off. Hereby, the output voltage Uo1 or Uo2 respectively always switches on the hysteresis of the comparator circuit K1 or K2 respectively and the output voltage Uo2 of the comparator circuit K2 or, respectively, the output voltage Uo1 of the comparator circuit K1 switches the hysteresis of the comparator circuit K1 or of the comparator K2 respectively off again. The circuit offers the advantage that only two comparator circuits are required for the generation of two output voltages whose zero crossings exactly coincide with the zero crossings of the input voltages.

The circuit can be extended in that several output voltages Uo in phase displaced cyclic sequence are generated in such a way in that the phase displaced input voltages Uix are applied each to a comparator circuit Kx whereby again each output voltage Uox of the comparator circuit Kx switches on the hysteresis of the comparator circuit Kx and the output voltage Uo(x+1) of the following comparator circuit X(x+1) switches the hysteresis of the preceding comparator circuit Kx off again. The output signal Uo(n) of comparator circuit Kn (e.g. when x=n) switches its own hysteresis on and that of comparator circuit K1 off.

We claim:

1. A circuit for generating square-shaped signals, comprising:

a source of a first input signal having successive zero amplitude crossings;

a first comparator for generating a first bilevel output signal responsive to said first input signal, said first comparator having a hysteresis characteristic which can be switched on and off, said hysteresis being switched on at each said zero crossing of said first input signal and being switched off prior to each occurrence of the next following zero crossing;

a source of a second input signal having successive zero amplitude crossings and displaced in phase relative to said first input signal; and, a second comparator for generating a second bilevel output signal responsive to said second input signal, said hysteresis characteristic being switched on by level transitions of said first bilevel output signal and being switched off by level transitions of said second bilevel output signal.

2. The circuit of claim 1, comprising first and second flip/flops for controlling said hysteresis characteristic responsive to said first and second bilevel output signals.

3. The circuit of claim 2, wherein said first and second flip/flops are set by said first bilevel output signal and reset by said second bilevel output signal, said first and second flip/flops controlling said switched hysteresis characteristic.

4. The circuit of claim 3, comprising:

a resistor for imparting said hysteresis characteristic, said resistor having a first terminal coupled to said first comparator and having a second terminal coupled to a junction;

a first diode, anode coupled to said junction and cathode coupled to an output of one of said first and second flip/flops;

a second diode, cathode coupled to said junction and anode coupled to an output of the other of said first and second flip/flops.

5. The circuit of claim 1, wherein said first and second input signals are sinusoidal.

6. A circuit for generating a plurality of square-shaped signals, comprising:

a plurality of sources for a plurality of input signals having successive zero amplitude crossings and progressive phase displacements relative to one another;

a plurality of comparators, each generating a bilevel output signal responsive to a different one of said plurality of input signals, each of said comparators having a hysteresis characteristic which can be switched on and off, said hysteresis being switched on at each said zero crossing of each respective input signal and being switched off prior to each occurrence of the next following zero crossing of each said respective input signal; and, said hysteresis characteristic of each said comparator being switched on by level transitions of its own said bilevel output signal and being switched off by level transitions of said bilevel output signal of another one of said comparators.

7. The circuit of claim 6, further comprising a pair of flip/flops operatively associated with each of said plurality of comparators, each said pair of flip/flops being responsive to said bilevel output signal of its associated comparator and to said bilevel output signal of another one of said comparators, each said pair of flip/flops controlling said hysteresis characteristic of said associated comparator.

8. The circuit of claim 6, wherein said progressive phase displacements of said plurality of input signals define a cyclical order of operation for said plurality of comparators, each said hysteresis characteristic being switched off responsive to said bilevel output signal of the next one of said comparators in said cyclical order.

9. The circuit of claim 8, further comprising a pair of flip/flops associated with each of said plurality of comparators, each said pair of flip/flops being responsive to said bilevel output signal of its associated comparator and to said bilevel output signal of said next one of said comparators in said cyclical order, each said pair of flip/flops controlling said hysteresis characteristic of said associated comparator.

* * * * *

UNITED STATES PATENT AND TRADEMARK OFFICE
CERTIFICATE OF CORRECTION

PATENT NO.  : 5,394,023

DATED       : February 28, 1995

INVENTOR(S) : Gunter Gleim et al.

It is certified that error appears in the above-identified patent and that said Letters Patent is hereby corrected as shown below:

On the title page: Item [54] and Column 1, line 1, delete "GENRATING" and insert ---GENERATING---

Item [56]
Attorney, Agent, of Firm -- delete "Trinoli" and insert ---Tripoli---

Signed and Sealed this

Twenty-fifth Day of June, 1996

Attest:

BRUCE LEHMAN

Attesting Officer        Commissioner of Patents and Trademarks